(12) United States Patent  (10) Patent No.: US 8,717,070 B1
Klein et al.  (45) Date of Patent: May 6, 2014

(54) MULTIFUNCTIONAL CONFIGURABLE ANALOG CIRCUIT BLOCK, METHODS, AND INTEGRATED CIRCUIT DEVICES HAVING THE SAME

(71) Applicant: Cypress Semiconductor Corporation, San Jose, CA (US)

(72) Inventors: Hans Klein, Pleasanton, CA (US); Jaskarn Johal, Mukilteo, WA (US); Harold Kutz, Edmonds, WA (US); Jean-Paul Vanitegem, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/929,638

(22) Filed: Jun. 27, 2013

Related U.S. Application Data

(60) Provisional application No. 61/778,116, filed on Mar. 12, 2013.

(51) Int. Cl.
*H03L 7/06* (2006.01)
(52) U.S. Cl.
USPC ........... 327/108; 327/109; 327/110; 327/111; 327/112
(58) Field of Classification Search
USPC ................................................. 327/108–112
See application file for complete search history.

(56) References Cited

U.S. PATENT DOCUMENTS

| | | | |
|---|---|---|---|
| 5,107,146 A | 4/1992 | El-Ayat | |
| 5,563,526 A | 10/1996 | Hastings et al. | |
| 5,574,678 A | 11/1996 | Gorecki | |
| 6,225,825 B1 | 5/2001 | Hopsecger | |
| 6,342,848 B1 * | 1/2002 | Johnson et al. | 341/118 |
| 6,373,954 B1 * | 4/2002 | Malcolm et al. | 381/119 |
| 6,405,093 B1 * | 6/2002 | Malcolm et al. | 700/94 |
| 6,628,999 B1 * | 9/2003 | Klaas et al. | 700/94 |
| 6,762,707 B2 * | 7/2004 | Wolf et al. | 341/155 |
| 6,806,771 B1 | 10/2004 | Hildebrant et al. | |
| 6,952,621 B1 * | 10/2005 | Malcolm et al. | 700/94 |
| 6,981,090 B1 * | 12/2005 | Kutz et al. | 710/317 |
| 7,050,029 B2 * | 5/2006 | Liang et al. | 345/96 |
| 7,233,466 B2 * | 6/2007 | Yamaguchi | 361/56 |
| 7,613,901 B2 | 11/2009 | Alfano et al. | |
| 7,804,286 B2 | 9/2010 | Lee | |
| 8,054,208 B2 | 11/2011 | Fletcher et al. | |
| 8,176,296 B2 | 5/2012 | Snyder | |
| 2002/0033804 A1 * | 3/2002 | Liang et al. | 345/173 |

* cited by examiner

*Primary Examiner* — Adam Houston (57) ABSTRACT

An integrated circuit device can include a plurality of analog circuit blocks, each comprising an input section configured to receive an analog input signal, and an output section configured to drive a plurality of output signals corresponding to the input signal, each output signal having a different maximum drive strength; and a signal network comprising a plurality of switches, and providing a configurable connection between at least outputs of the analog circuit blocks and a plurality of N connections to the integrated circuit device, including less than N direct signal paths between each analog circuit block and the N connections.

15 Claims, 10 Drawing Sheets

MULTIFUNCTIONAL CONFIGURABLE ANALOG CIRCUIT BLOCK, METHODS, AND INTEGRATED CIRCUIT DEVICES HAVING THE SAME

This application claims the benefit of U.S. Provisional Patent Application Ser. No. 61/778,116 filed on Mar. 12, 2013, the contents of which are incorporated by reference herein.

TECHNICAL FIELD

The present disclosure relates generally to integrated circuit devices having reconfigurable blocks, and more particularly to devices having reconfigurable analog circuit blocks.

BACKGROUND

Integrated circuits (e.g., chips) that offer a wide range of programmable functions and parameters can provide advantageous flexibility in the design of electronic devices. To alter, adjust or optimize performance, such chips can be configured/reprogrammed/reconfigured on the chip, without requiring working knowledge of many different fixed-solution chips, and generally not even requiring changes on the printed circuit board.

Unlike many configurable digital blocks, employing configurable analog blocks for analog applications can present challenges. Analog loads can vary, requiring different driving requirements. One solution can be to increase the number/types of analog blocks on a chip, but such an approach can be costly, increasing chip size. Further, addressing the various types of loads for analog circuits can require the use of external components for compensation (e.g., address ringing, overshoot, etc.).

DETAILED DESCRIPTION

Various embodiments will now be described that show integrated circuit devices, systems and methods that can include one or more configurable/reconfigurable analog blocks having output stages capable of providing one of a number of different drive strengths. In some embodiments, a direct wiring path can be provided between an output stage and an external connection (e.g., pin) to the device, to enable such a connection to be driven directly by the output stage. Embodiments can also include the analog blocks can being operational amplifier (op amp) blocks with variable drive outputs. Further, in very particular embodiments, such op amp blocks can include a comparator circuit to generate a comparator output in response to an analog op amp input.

Embodiments can also include a reconfigurable network of active and/or passive elements connected between inputs and outputs of circuits within the analog block. Such a network can provide compensation for particular loads/responses. In op amp variations, such a network can enable the implementation of programmable gain amplifiers.

Embodiments can include various other features as will be described below.

Figure 1:
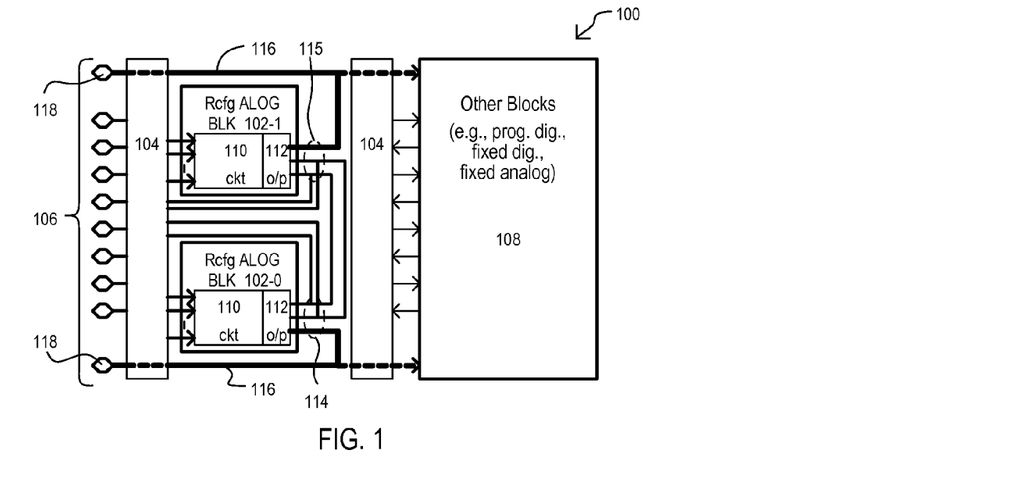
FIG. 1 is a block schematic diagram of an integrated circuit (IC) device according to an embodiment.

FIG. 1 is a block schematic diagram of an integrated circuit (IC) device 100 according to an embodiment. IC device 100 can include reconfigurable analog blocks (two shown as 102-0/1), a switch fabric 104, IC connections 106, and other circuit blocks 108. Analog blocks 102-0/1 can provide analog functions, receiving analog input signals and/or generating analog output signals. Analog blocks 102-0/1 can be reconfigurable via switch fabric 104 (i.e., input and outputs can have various connections) and/or internally (i.e., analog blocks can programmed between various different functions).

It is noted that while embodiments disclosed herein describe various items as being reconfigurable, such items can also be configurable.

Referring still to FIG. 1, each analog block 102-0/1 can include an analog circuit section (shown as 110 for block 102-0) and an output driver section (shown as 112 for block 102-0). Analog circuits 110 for each analog block 102-0/1 can be the same or can be different from one another. Output driver sections 112 for each block can provide multiple outputs 114 (in this embodiment three, but in other embodiments two different outputs can be provided, or more than three different outputs can be provided). Outputs 114 can represent at least two different drive strengths (e.g., two different maximum currents or maximum voltages).

In the particular embodiment shown, a strong drive strength output can be connected to an IC connection 118 by a strong drive signal path 116, shown by a bold line in FIG. 1. A strong drive signal path 116 can be different from other (i.e., weaker drive) signal paths. In some embodiments, a strong signal path 116 can include any of: a "direct" signal path that does not include any intervening switch elements or the like; a high current path (i.e., a signal path having a higher current tolerance than other signal paths) which may or may not include high current switch elements; and/or a high voltage path (i.e., a signal path having a higher voltage tolerance than other signal paths) which may or may not include high voltage switch elements.

According to embodiments, a number of strong drive signal paths (e.g., 116) can exist between each analog block 102-0/1 and those IC connections 106 connected to switch fabric 104. However, the number of such strong signal paths (116) can be less than the number of IC connections 106. Thus, in the very particular embodiment of FIG. 1, there are shown ten IC connections 106, but only two direct signal paths (116) (i.e., 2<10).

In the embodiment shown, each analog block 102-0/1 can receive input signals from switch fabric 104. However, in alternate embodiments, an analog block 102-0/1 may not receive any input signals (i.e., can be a signal generator circuit that does not process input signals), or may receive input signals via a direct connection (i.e., not through a switch fabric).

A switch fabric 102 can include a number of switch elements to enable reconfigurable connections between inputs to analog blocks, between outputs from analog blocks, or between inputs and outputs of the analog blocks. In addition, a switch fabric 102 can receive signals from, or output signals to, other portions of an IC device (including but not limited to other blocks 108).

IC connections 106 can provide physical connections to integrated circuit device 100, and can vary according to the IC device form (e.g., pins, pads, bumps, leads, etc.). Connections 106 can serve as input connections, output connections, or both. Further, connections 108 can include those dedicated to analog signals, digital signals (which are routable to digital circuits) or both (i.e., general purpose I/Os).

Other blocks 108 can include one or more other circuit blocks for providing additional functions of an integrated circuit device. Other blocks 108 can include, but are not limited to fixed analog circuits, fixed digital circuits (including processors), reconfigurable analog circuits, reconfigurable digital circuits, and memory circuits (including volatile and/or nonvolatile memory cells).

As noted above, in particular embodiments, reconfigurable analog blocks can be op amp blocks. Particular op amp embodiments will now be described with reference to FIGS. 2A to 2C.

Figure 2A:
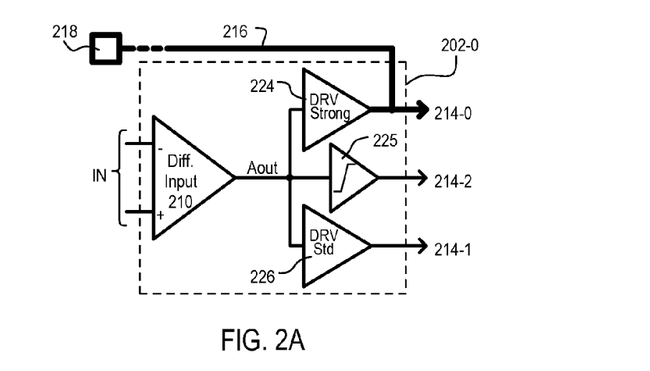
FIGS. 2A to 2C are block schematic diagrams of reconfigurable analog circuit blocks having operational amplifier and comparator functions, according to embodiments.

FIG. 2A is a block schematic diagram of a reconfigurable op amp block 202-0 according to one embodiment. Op amp block 202-0 can include an input stage 210, "strong" output driver 224, and "weak" output driver 226. An input stage 210 can be a high input impedance stage. In the embodiment shown, input stage 210 is a differential input stage, but alternate embodiments can include single ended input stages. In response to an input signal (IN), input stage 210 can generate an analog output signal (Aout). An analog signal (Aout) can also be differential or single ended.

In particular embodiments, input stage 210 can be a high-gain differential input stage, which can be shared by the two output drivers (224, 226). Because an input stage of an op amp can consume large amount of area (e.g., roughly half the area of an op amp), it can be advantageous that the input stage can serve both drivers (224, 226). This is even more valuable if the input stage comprises of complex circuitry, such as choppers or offset and offset-drift compensation circuitry.

Output drivers (224, 226) can drive Aout to generate analog output signals on block outputs 214-0/1. Output drivers (224, 226) can be strong or weak relative to one another. That is, strong output driver 224 can have a greater drive strength than weak output driver 226. In particular embodiments, output drivers (224, 226) can be analog drivers as they can be capable of generating an output signal having any value over a minimum and maximum output range. In some embodiments, output drivers (224, 226) can be tristatable (i.e., their outputs can be switched to a high impedance state).

In the embodiment of FIG. 2A, an output of strong output driver 224 can be connected to an IC device connection 218 (e.g., pin) via a strong drive signal path 216. A strong signal 216 path can take the form of any of those described herein, or equivalents (e.g., a direct connection or a connection through switches having a higher voltage and/or current tolerance than other signal paths of the device). In this way, block output 214-1 (weak driver output) can be designed to drive smaller (often on-chip) loads, which also allows for some routing resistance in the output (wire), making it more versatile in that the output can be routed to many places on the chip. By contrast, block output 214-0 (strong driver output) can be hardwired to a connection (e.g., pad) to offer a very low series resistance in the signal path. In some embodiments, a strong output driver 224 can provide a larger maximum drive current than weak driver current 226. In a various embodiments, a maximum drive current of strong output driver 224 can be more than four times that of weak output driver 226 or more than nine times that of weak output driver 226.

In the embodiment of FIG. 2A, an op amp block 202-0 can also include a comparator circuit 225. A comparator circuit 225 can have an input that receives the output of the input stage 210 (i.e., Aout), and can provide a comparator output on block output 214-2. A comparator circuit 225 can provide a comparator response, which can be digital-like, driving between a high and low value in response to the Aout signal. In particular embodiments, comparator circuit 225 can have a faster response than an input stage 210 and output driver (224 or 226) operating in an open loop gain configuration. Further, a comparator circuit 225 can consume less current/power than configurations using an output driver (224 or 226).

Figure 2B:
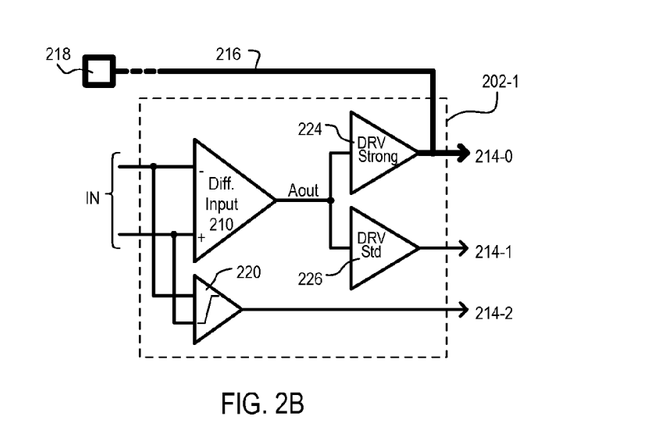

FIG. 2B is a block schematic diagram of a reconfigurable op amp block 202-1 according to another embodiment. Op amp block 202-1 can include items like those of FIG. 2A, and such like items have the same reference characters.

FIG. 2B differs from FIG. 2A in that it can include a comparator circuit 220 having inputs connected to inputs of the input stage 210. Comparator circuit 220 may provide greater performance than the arrangement of FIG. 2A, however, at the cost of more circuit area, as comparator 225 from FIG. 2A can leverage the circuits of differential input stage 210.

Figure 2C:
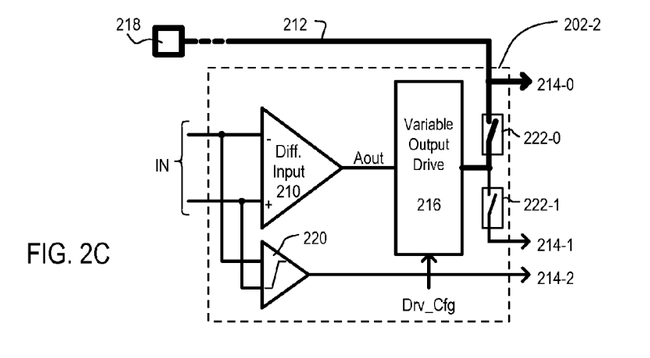

FIG. 2C is a block schematic diagram of a reconfigurable op amp block 202-2 according to another embodiment. Op amp block 202-2 can include items like those of FIG. 2B, and such like items have the same reference characters.

FIG. 2C differs from FIG. 2B in that it can include a configurable output driver 226, instead of separate output drivers, as well as output switches 222-0/1. A configurable output driver 226 can be reconfigured between different drive strengths. Output switches 222-0/1 can connect an output of variable output driver 226 to any of multiple block outputs (e.g., 214-0/1). Thus, when configurable output driver 226 has a strong drive configuration, output switch 222-0 can be enabled (and switch 222-1 can be disabled), and when configurable output driver 226 has a weak drive configuration, output switch 222-1 can be enabled (and switch 222-0 can be enabled or disabled).

In addition to providing varying output drive strengths, configurable/reconfigurable analog blocks according to some embodiments can further include configurable/reconfigurable networks composed of passive or other circuit elements connected to the output driver(s) and/or analog circuit (e.g., input stage). Such networks can be configured to enhance or alter the operation of the block. As examples, such reconfigurable networks can be configured to provide compensation networks for driver stages to optimize driver performance (e.g., reduce or eliminate ringing, overshoot etc.) or, in op amp variations, provide programmable feedback stages to enable a programmable gain amplifier.

Figure 3A:
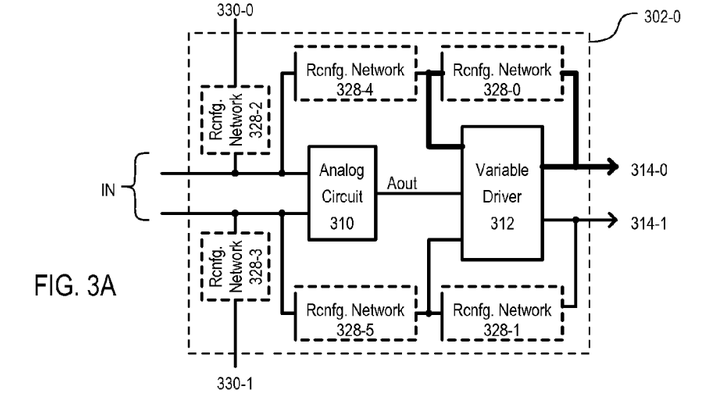
FIG. 3A to 3E are block schematic diagrams of reconfigurable analog circuit blocks having reconfigurable networks, including amplifier circuits with programmable compensation and/or programmable gain.

FIG. 3A is a block schematic diagram of a reconfigurable analog block 302-0 according to another embodiment. An analog block 302-0 can include an analog circuit 310 and output driver section 312. Analog circuit 310 can be any suitable analog circuit (e.g., differential input stage), and does not necessarily receive input signals (IN) (i.e., can be a signal generator circuit). Output driver section 312 can take the form of any of those shown herein, or equivalents, including separate output drivers or a reconfigurable output driver.

In addition, analog block 302-0 can also include any or all of reconfigurable networks 328-0 to 328-5. Reconfigurable networks 328-0/1 can be connected between different drive strength outputs (314-0/1) and the output driver section 312. Reconfigurable networks 328-2/3 can be connected between inputs (IN) and nodes 330-0/1. In some embodiments, nodes 330-0/1 can be connected directly, or indirectly, to a power supply node (e.g., ground, VSS). Reconfigurable networks 328-4/5 can be connected to inputs of the analog block 302-0 and to outputs (314-0/1) of the analog block 302-0, either directly or indirectly (e.g., via reconfigurable networks 328-0/1). In some embodiments, one or more reconfigurable networks (e.g., 328-0) can be high drive tolerant network, having elements and signal paths suitable for high drive conditions, while others of the reconfigurable networks can be a low drive tolerant networks, having elements or signal paths not suitable to the high drive conditions.

Figure 3B:
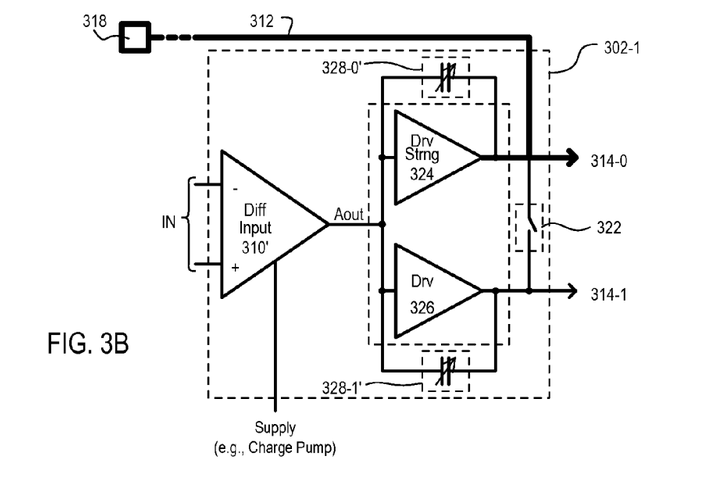

FIG. 3B is a block schematic diagram of a reconfigurable analog block 302-1 according to another embodiment. FIG. 3B shows one example of an op amp type configuration, and can be one particular implementation of that shown in FIG. 3A. An analog block 302-1 can include a differential input stage 310', strong output driver 324, and weak output driver 326. Such sections can have a configuration like that of FIG. 2A.

In addition, FIG. 3B shows reconfigurable network 328-0' between an output and input of driver 324, reconfigurable network 328-1' between an output and input of driver 326, and an output switch 322 connected between outputs 314-0/1. In the embodiments shown, reconfigurable networks 328-0'/1' can serve as compensation components, shown as programmable capacitors. Such capacitors can take various forms, and can be as simple as a few capacitor elements that can be connected together in parallel, so as to adjust the level of compensation. Alternatively, reconfigurable networks 328-0'/1' can have more complex combinations of capacitive and resistive elements. Thus, each output driver (324, 326) has have its own respective compensation network (328-0'/1'), individually sized and adjustable for the job at hand. The output drivers (324, 326) can be optionally connected together by an output switch 322, although this may require for one of the two output drivers to be tri-stated.

Compensation components can be utilized so as to avoid undesired transient response (such as overshoot) and avoid instability (oscillation). It is noted that while such compensation can limit a bandwidth of a response, another output driver (or analog block) can be provided which can be optimized for a lower load, high bandwidth response. In this way, an analog block can be optimized for various different loads.

Figure 3C:
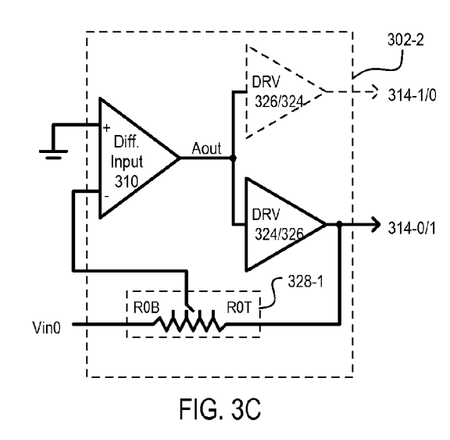

FIG. 3C is a block schematic diagram of a reconfigurable analog block 302-2 according to a further embodiment. FIG. 3C shows one example of an op amp type block configured into an inverting op amp, and can be one particular implementation of that shown in FIG. 3A. In FIG. 3C, a reconfigurable network 328-1 is included that can provide a programmable resistance that can be "tapped" to provide two resistance values (R0T, R0B). By altering a tap point within network 328-1, a gain of the inverting amplifier can be programmed.

Figure 3D:
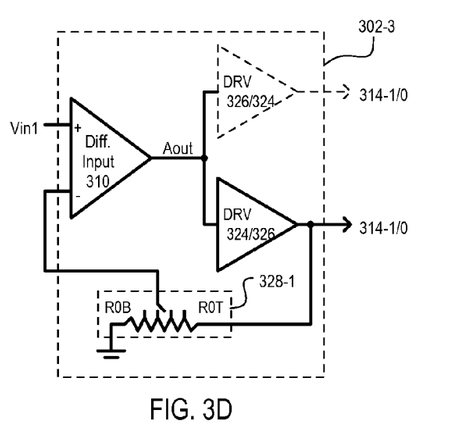

FIG. 3D shows an analog block 302-3 according to another embodiment. FIG. 3D shows a non-inverting amplifier configuration. A gain of the amplifier can be adjusted according to a tap point of reconfigurable network 328-1.

Figure 3E:
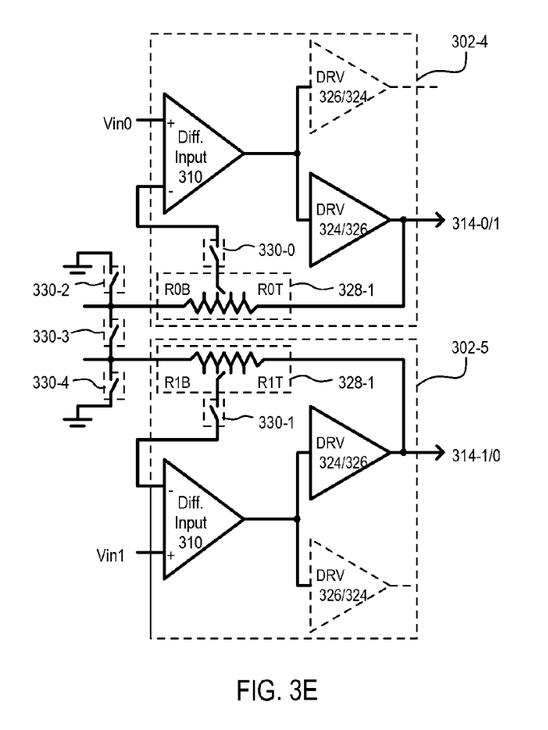

FIG. 3E is a block diagram of two op amp blocks 302-4/5 configured into a differential mode type programmable gain amplifier (i.e., an "instrumentation amplifier" configuration). FIG. 3E also shows how a tapping point of a reconfigurable network 328-1 can be configurable via switch 330-0. Further, a bottom end of reconfigurable networks 328-1 can be connected to a supply node (e.g., ground), or to one another, via switches 330-2, -3 and -4. It is understood that the state of such switches can established by configuration information (i.e., are programmable).

Referring back to FIGS. 3C to 3E, in the various configurations, an output driver of the op amp can be a weak driver 326 or a strong driver 324. However, in particular embodiments, resistors in a reconfigurable network (e.g., 328-1) can be "on-chip" resistors that present a relatively light load. Consequently a weak output driver 326 can be used on such configurations, as it may draw a lower operating current than a strong output driver, and allow for a higher response bandwidth.

As shown in FIGS. 2A to 2C, according to some embodiments, reconfigurable analog blocks can include comparator circuits (e.g., 225, 220). In such embodiments, it can be beneficial for such comparators to operate with some hysteresis.

Figure 4A:
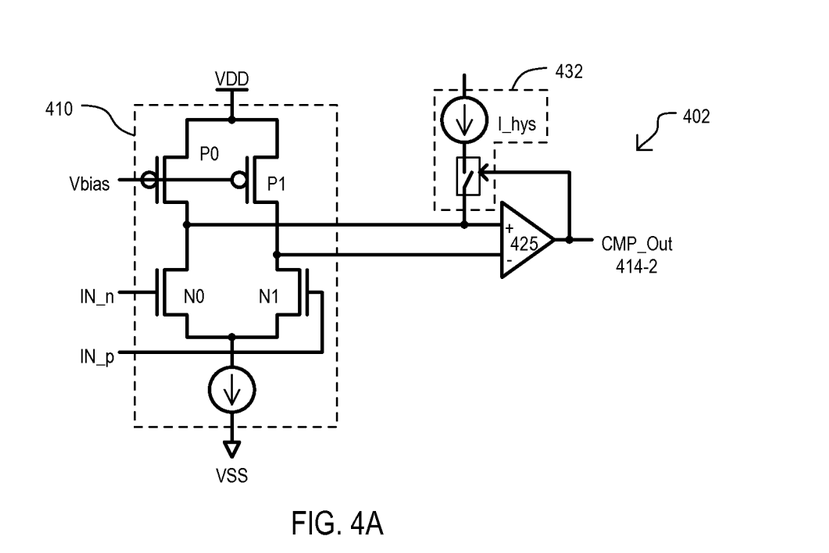
FIGS. 4A and 4B show comparator hysteresis that can be included in embodiments.

FIG. 4A is a block schematic diagram of a portion an analog block 402, according to an embodiment. FIG. 4A shows a differential input stage 410 that provide differential outputs to a comparator circuit 425. It is understood that differential input stage 410 represents but one implementation of an input stage.

Hysteresis can be provided with an internal feedback path 432 from an output of the comparator circuit 425 back to the differential input stage 410. The feedback path 432 can include a current source I_hys and feedback activated switch. A comparator feedback signal can be used to drive a feedback circuit (e.g., current source), which can inject a signal back into the input stage 410 in such way that positive feedback is achieved. As a result of positive feedback, a comparator signal can have a response is as indicated in FIG. 4B.

Figure 4B:
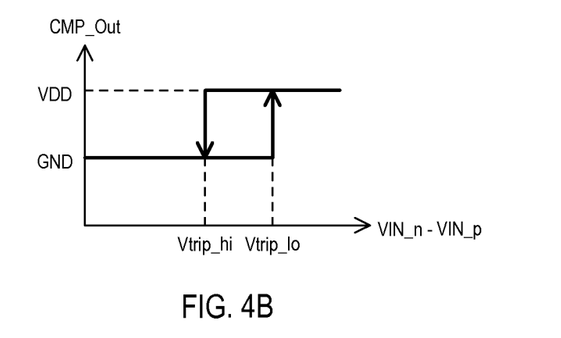

FIG. 4B is a graph showing a comparator output (CMP_out) versus analog input signal (VIN_n-VIN_p) having a response with hysteresis. It is understood that the amount of feedback (e.g., I_hys) can be programmable, thus the width of the hysteresis (e.g., 10 to 20 mV or more) can be made user-programmable, or can be turned off altogether.

It is understood that FIGS. 4A and 4B represent but one implementation of comparator hysteresis, and any suitable hysteresis approach can be utilized.

Figure 5:
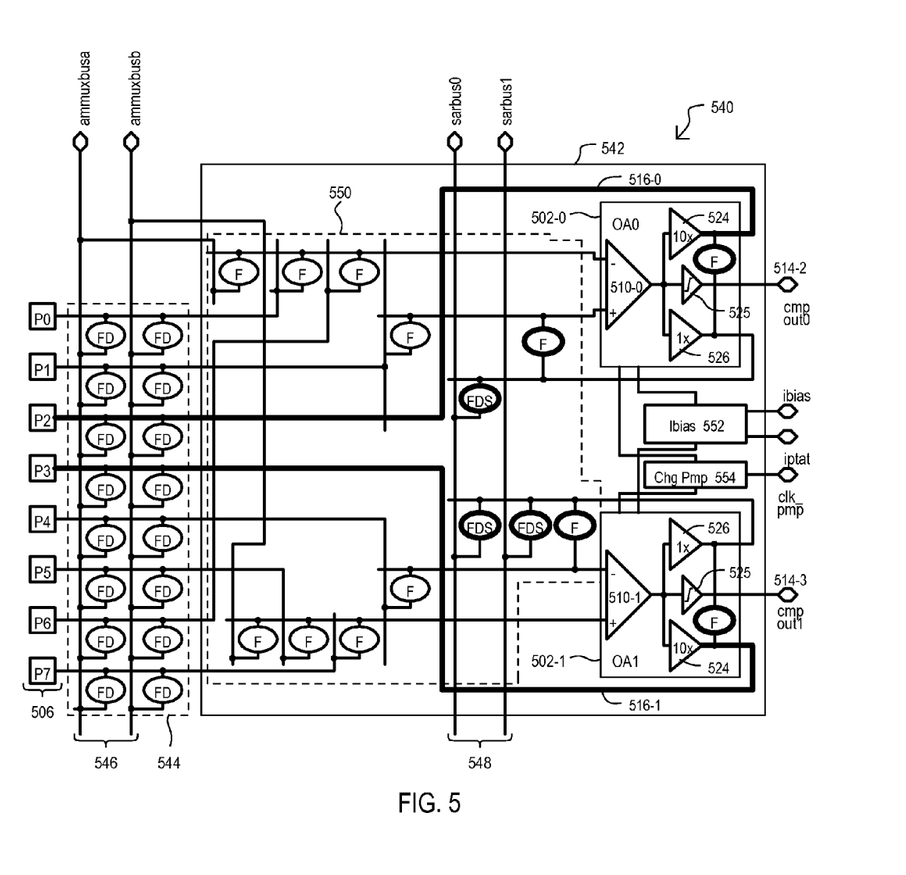
FIG. 5 is a block schematic diagram of an IC device according to another embodiment.

FIG. 5 is block schematic diagram of an IC device 540 according to an embodiment. IC device 540 can include a configurable/reconfigurable analog section 542, application specific analog bus 548, general analog bus 546, bus switch fabric 544, and device connections 506 (P0 to P7). It is understood that IC device 540 can include various other circuit sections, connected directly or indirectly to analog section 542. Such other sections can include, but are not limited to: other analog sections (fixed or reconfigurable) or digital sections (fixed or reconfigurable). It is understood such circuits can include memory circuits (volatile or nonvolatile), processor circuits, physical communication interfaces, and/or wireless transmit/receive circuits.

Referring still to FIG. 5, switch elements for the various switch fabrics are identified as "F", "FD" and "FDS". In some embodiments, this designation indicates how such a switch can be controlled. In one very particular embodiment, F can indicate a switch controlled by firmware for the device, FD indicates a switch that can be controlled by firmware or other circuits of the device (e.g., digital circuits), FDS indicates a switch that can be controlled by firmware or additional circuits of the device (e.g., digital or analog control circuits, such as a sequencer).

In FIG. 5, some switch elements and wiring lines are represented with bold lines, which indicate that the wiring path/switch is intended to carry a larger current and/or provide a lower resistance than non-bolded items. Accordingly, such bolded items can have sizes and/or be made of materials suitable to provide such a higher current tolerance and/or a lower resistance.

A reconfigurable analog section 542 can include reconfigurable analog blocks 502-0/1, block switch fabric 550, and block support circuits 552/554. Reconfigurable analog blocks 502-0/1 can each include an input stage common to multiple output stages of differing responses. In the particular embodiment shown, analog blocks 502-0/1 are op amp type blocks, each including a differential input section 510-0/1, strong output driver 524, weak output driver 526, comparator circuit 525, and switch element "F". Such blocks can take the form of, or operate in a manner like, any of those shown herein, or equivalents (including reconfigurable networks for compensation, variable gain, etc.).

In the particular embodiment shown, outputs of strong drivers 524 can be connected to strong signal paths 516-0/1, which can provide a direct connection to external connections P2 and P3. This can enable loads external to the IC device 540 (at connections P2 or P3) to be directly driven by a strong output driver 524. In contrast, outputs from weak drivers 526 can be connected to any of external connections 506 via one or more switch elements. Thus, the number of direct connections (two, to P2/P3) is less than the number of total connections (eight, P0 to P7).

It is noted that while the embodiment of FIG. 5 shows particular relative drive strengths (10× and 1×), other embodiments can include different drive strength variations.

Because analog blocks 502-0/1 are op amp blocks in the particular example shown, support circuits can include a current bias circuit 552, which can provide bias currents to differential input stages 510-0/1, and a charge pump circuit 554 that can generate power supply voltages for differential input stages 510-0/1, output drivers 524/526 and/or comparator circuits 525. In a particular embodiment, a current bias circuit 552 can receive an input reference current (ibias), as well as a temperature compensation current (iptat) (e.g., a current proportional to absolute temperature). Current bias circuit 552 can replicate the current ibias, and compensate for temperature, if needed. A charge pump circuit 554 can receive an input signal clk_pmp to enable charge pumping to levels above or below the input power supply to the IC device.

An application specific analog bus 548 can run through analog section 540, and can provide a signal path to one or more other particular circuits (not shown) of the IC device. Further, a weak output driver 526 can be connected to such a bus via low resistance switches. Thus, a weak driver 526, which can consume less power than a strong driver 524, can be used to drive buses internal to the IC device. In the particular embodiment shown, analog bus 548 can provide a connection to an analog-to-digital converter (ADC) circuit located on the same IC device 540. In such an arrangement, an op amp block (502-0/1) can drive a received analog signal on the analog bus 548 via any of a number or low resistance switches. Further, a weak output driver 526 can be used to drive the signal, for a relatively low power consumption stage. Of course such an ADC applications represents but one very particular configuration.

Referring still to FIG. 5, within analog section 540, block switch fabric 550 can provide switch connections to application specific bus 548, general analog bus 546, and device connections 506. While FIG. 5 shows a particular control arrangement (i.e., F, FD, FDS) alternate embodiments can include any combination of control for any of the switches. Further, alternate embodiments can include different combinations of low resistance (shown by bold lines) and relatively higher resistance switches.

General analog bus 546 can be shared by multiple analog sections having various functions. Thus, any number of programmable analog circuits can be interconnected to one another. Bus switch fabric 544 can provide reconfigurable signal paths between all of: IC device connections 506, general analog bus 546 and analog section 540.

Figure 6A:
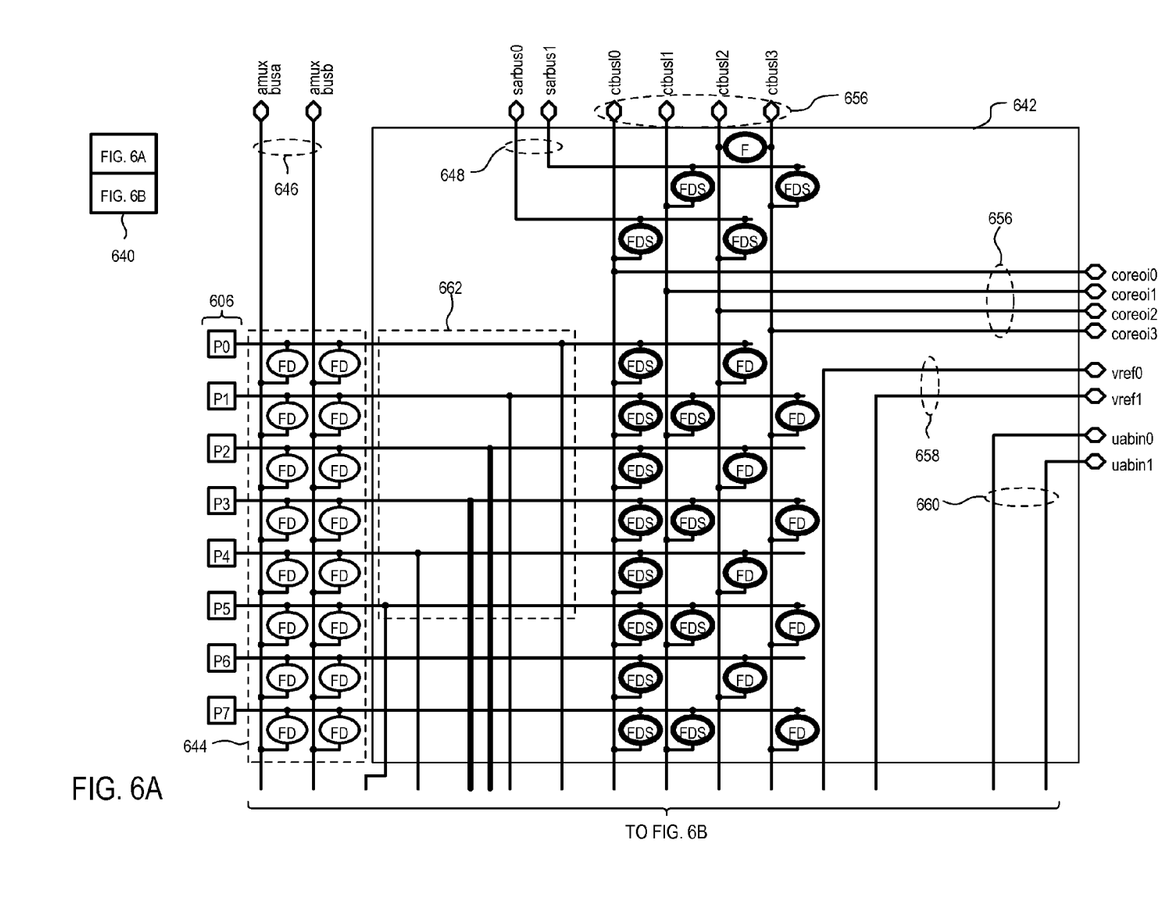
FIGS. 6A and 6B together are a block schematic diagram of an IC device according to further embodiment.
Figure 6B:
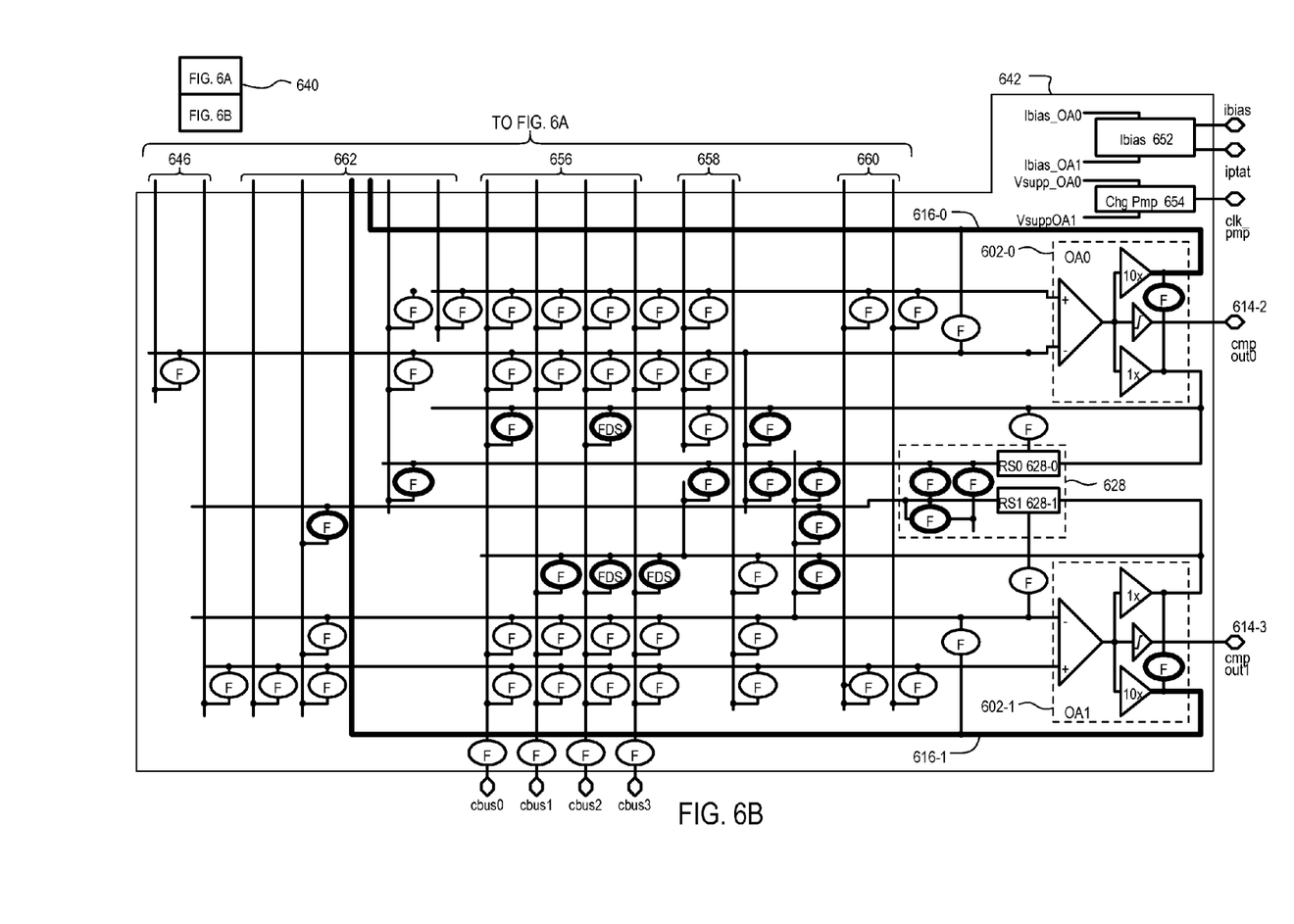

FIGS. 6A and 6B (shown on separate sheets to be viewed together) are a block schematic diagram of an IC device 540 according to another embodiment. FIGS. 6A/B include items like those of FIG. 5, and such like items are referred by the same reference character but with the leading digit being a "6" instead of a "5". Such like items can have the same or equivalent structures and functions.

FIGS. 6A/6B differ from FIG. 5 in that a reconfigurable analog section 642 can include a more complex switch fabric, including connections to a general analog bus 646, an internal block bus 662, an inter block bus 656, a reference bus 658, and an analog bus 660. An internal block bus 662 can provide interconnections between the various circuit blocks and buses of the analog section 642. A inter block bus 656 (ctbus0 to ctbus3) can provide interconnections between analog blocks of a particular type. Reference bus 658 can provide reference values to analog section 642, which in the particular embodiment shown, can be reference voltages. Analog bus 660 (uabin0/1) can be designated to carry analog signals.

FIG. 6B also shows a reconfigurable network 628, which can include circuit elements that can be connected with one another (e.g., capacitive, resistive, diode-like, etc.). In the embodiment shown, reconfigurable network 628 can include resistor structures 628-0/1 that can be tapped in different places to provide a programmable resistance, as described herein, or equivalents.

Figure 7:
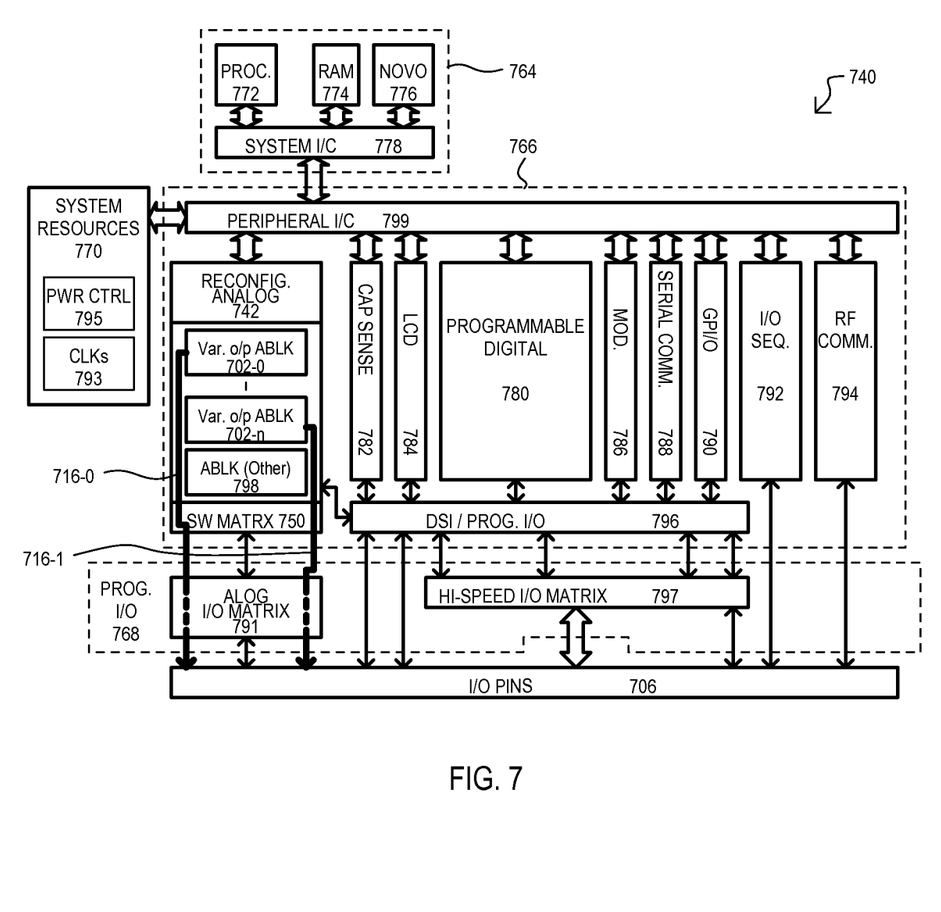
FIG. 7 is a block schematic diagram of a programmable system on chip type IC device according to an embodiment.

FIG. 7 is a block schematic diagram of an IC device 740 according to a further embodiment. An IC device 740 can be a programmable system-on-chip (SoC) having a central processing unit (CPU), reconfigurable digital blocks, reconfigurable analog block (include those described herein, or equivalents), and programmable interconnects between the various sections and I/O pins. In the embodiment shown, an IC device 740 can include a processor section 764, a programmable section 766, a programmable I/O fabric 768, and system resources 770.

A processor section 764 can include a CPU 772, random access memory (RAM) 774, and nonvolatile memory 776 interconnected to one another via a system interconnect 778. A nonvolatile memory 776 can store instructions for execution by CPU 772 as well as configuration information for programming programmable section 766.

A programmable section 766 can include various programmable circuits and interconnects, including programmable analog blocks (which can include fixed function analog circuits), programmable digital blocks, and other fixed function circuits. In the embodiment shown, programmable section 766 can include an analog section 742, a digital section 780, a capacitance sense section 782, a liquid crystal display (LCD) driver section 784, a modulator section 786, a serial communications section 788, a general purpose I/O (GPIO) path 790, an I/O sequencer section 792, an RF communication section 794, and a digital system interconnect (DSI) and programmable I/O 796.

An analog section 742 can include configurable/reconfigurable analog blocks (702-0 to 702-*n*), which can take the form of any of those shown herein, or equivalents. Any of analog blocks (702-0 to 702-*n*) can be op amp blocks, as described herein, or equivalents, having a common differential input stage and an output stage that provides different drive capabilities. In the embodiment shown, analog section 742 can include another analog block 798, which can provide a particular function. In one embodiment, analog block 798 can be a successive approximation type ADC (SARADC).

Analog section 742 can further include a switch matrix 750 which can include switches and routing lines of different resistances and/or current capabilities, as described in other embodiments herein, or equivalents. As represented by bold lines, analog blocks (702-0 to 702-*n*) can provide low resistance and/or high current paths (716-0/1) to I/O pins 706. Such paths can be direct (i.e., not include any switch elements), or include low resistance and/or high current switches. Analog section 742 can also include switch fabric 750, which can enable additional routing of analog signals between analog blocks (702-0 to -n), as described herein, or equivalents.

A digital section 780 can include programmable digital blocks that are configurable/reconfigurable to provide any of a number of digital functions. In some embodiments, a digital section 780 can provide control signals for controlling operations within analog section 742.

A capacitance sense (capsense) section 782 can include capacitance sensing circuits for sensing capacitance on I/O pins (i.e., for touch sense applications and the like). An LCD driver section 784 can generate signals for controlling an LCD display. A modulation section 786 can provide any of various modulation functions. As but one example, a modulation section 786 can perform pulse width modulation. A serial communication section 788 can provide serialization, de-serialization, encoding and decoding according to one or more serial communication standards. In particular embodiments, serial communications sections 788 can enable communications according to any of the following standards: a controller area network (CAN), I$^2$C, universal serial bus (USB), and/or IEEE 1394.

A GPIO path 790 can enable external connections (I/O pins) 706 to serve as digital or analog inputs, for greater flexibility in the routing of signals.

An I/O sequencer 792 can provide for a sequential connection of a group of external connections 706 to analog blocks within IC device 740. For example, an I/O sequencer 792 can enable the automatic scanning of selected I/O pins 706.

An RF communication section 794 can include radio communication circuits to enable radio communication with other devices.

A peripheral interconnect fabric 799 can enable various portions of the IC device 740 to communicate with one another. In particular embodiments, peripheral interconnect fabric 799 can enable communications between processor section 764 and all programmable sections. In addition, a digital system interconnect (DSI) and programmable I/O fabric 796 can enable some of the portions of programmable section 766 to communicate with one another.

A programmable I/O fabric 768 can also enable programmable interconnections between external connections 706 and the various circuits shown. In the embodiment shown, a programmable I/O fabric 768 can include an analog I/O matrix 791 and a high speed I/O matrix 797. An analog I/O matrix 791 can enable reconfigurable signal paths between I/O pins 706 and analog section 742. High speed I/O matrix 797 can enable high speed communications between an external connection and other circuits within the IC device 740.

System resources 770 can include power control circuits 795 and clock circuits 793. Power control circuits 795 can selectively place different portions of the IC device into lower power consumption modes. In some embodiments, power control circuits 770 can place a processor section 764 into a lower power (e.g., sleep) mode while an analog block (702-0 to -n) can generate data. Once such data is ready, the processor section 764 can switch to a higher power mode. Clock circuits 793 can generate timing signals for use by the IC device 740.

In one very particular embodiment, an IC device 740 can be from the PSoC® family of programmable embedded system-on-chip devices, manufactured by Cypress Semiconductor Corporation of San Jose, Calif., U.S.A.

As noted above, while embodiments have shown op amp type reconfigurable analog blocks, embodiments can include various other type blocks. FIGS. 8 to 11 show examples of other analog blocks according to embodiments. FIGS. 8-11 can include items like those of FIG. 2A, and like items are referred to by the same reference character, but with the leading digit(s) corresponding to the figure number. It is also understood that any of FIGS. 8 to 11 can include reconfigurable networks that can be used to tune output drivers, as described herein, or equivalents.

Figure 8:
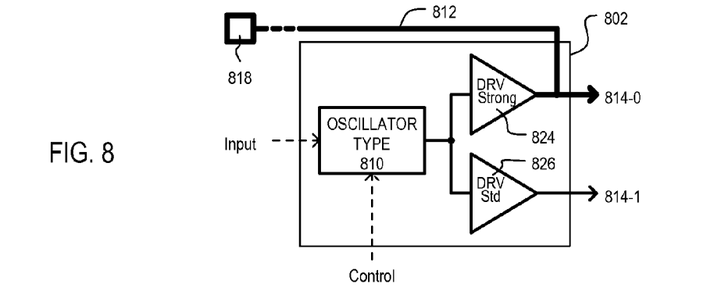
FIG. 8 is a block schematic diagram of an oscillator type reconfigurable analog block according to an embodiment.

FIG. 8 shows an analog block 802 according to an embodiment. Analog block 802 can differ from FIG. 2A in that an input stage 810 can be an oscillator type stage. An oscillator type stage 810 can include an oscillator or related circuit, including but not limited to: oscillator circuits (e.g., tuned, multivibrator, ring), phase locked loops, and delay locked loops. In some embodiments, an oscillator stage 810 can connect to external components (inductors, crystals) via switches, while in other embodiments all oscillator elements can be integrated circuit devices. Accordingly, depending upon implementation, an input stage 810 can receive inputs and/or control values.

Figure 9:
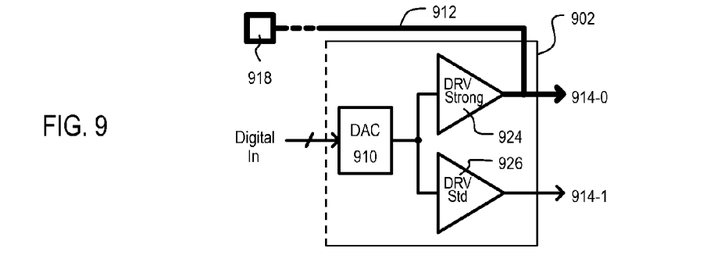
FIG. 9 is a block schematic diagram of a digital-to-analog converter type reconfigurable analog block according to an embodiment.

FIG. 9 shows an analog block 902 according to another embodiment. Analog block 902 can differ from FIG. 2A in that an input stage 910 can be a digital-to-analog converter (DAC). A generated output voltage can be driven by a strong and/or weak output driver (924/926).

Figure 10:
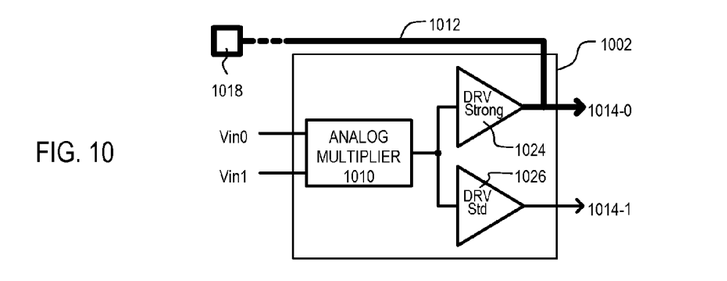
FIG. 10 is a block schematic diagram of an analog multiplier type reconfigurable analog block according to an embodiment.

FIG. 10 shows an analog block 1002 according to another embodiment. Analog block 1002 can differ from FIG. 2A in that an input stage 1010 can be an analog multiplier circuit. A generated output voltage can be driven by a strong and/or weak output driver (1024/1026).

Figure 11:
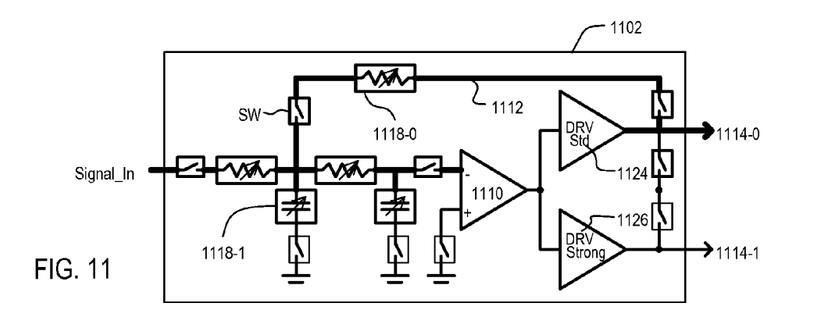
FIG. 11 is a block schematic diagram of an active filter type reconfigurable analog block according to an embodiment.

FIG. 11 shows an analog block 1102 according to another embodiment. Analog block 1102 can differ from FIG. 2A in that a reconfigurable network configured to provide an active filter. Reconfigurable network can be composed of programmable resistors (one shown as 1118-0), programmable capacitors (one shown as 1118-1), and switch elements (one shown as SW). Switch elements (e.g., SW) can include low resistance switches for signal and feedback paths.

Of course, the reconfigurable analog blocks of FIGS. 8 to 11 show but a few of many possible analog blocks.

The embodiments above have shown circuits, devices and corresponding methods. Additional method embodiments will now be described with reference to flow diagrams.

Figure 12:
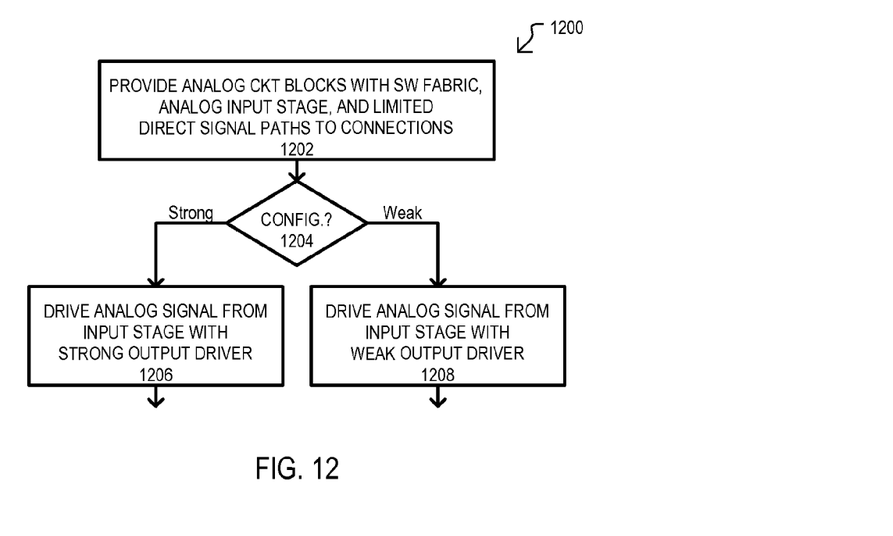
FIG. 12 is a flow diagram of a method according to an embodiment.

FIG. 12 is a flow diagram of a method 1200 according to one embodiment. A method 1200 can include providing analog circuit blocks with a switch fabric, analog input stage, and limited direct signal paths to connections 1202. Limited direct signal paths can include a smaller number of direct signal paths as compared to the number of available connections. If an integrated circuit has one configuration (Strong from 1204), an analog signal from the input stage can be driven with a strong output driver 1206. If the integrated circuit has another configuration (Weak from 1204), an analog signal from the input stage can be driven with a weak output driver 1208.

It is understood that while some configurations may provide for only weak or strong driving (1206 or 1208), other configurations can include weak and strong driving (i.e., 1206 and 1208).

Figure 13:
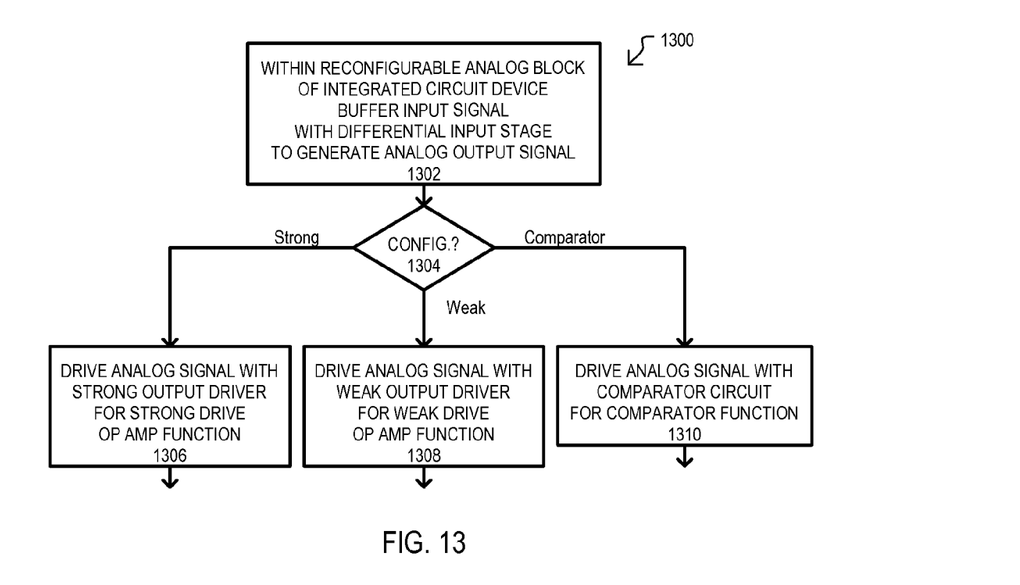
FIG. 13 is a flow diagram of a method according to another embodiment.

FIG. 13 is a flow diagram of a method 1300 according to another embodiment. A method 1300 can occur in an analog block of an integrated circuit device, and can include buffering an input signal with a differential input stage to generate an analog output signal 1302.

If an integrated circuit has one configuration (Strong from 1304), an analog signal from the input stage can be driven with a strong output driver to provide a strong drive op amp function 1306. If the integrated circuit has another configuration (Weak from 1304), the analog signal from the input stage can be driven with a weak output driver to provide a weak drive op amp function 1308. If the integrated circuit has another configuration (Comparator from 1304), the analog signal from the input stage can be driven with a comparator circuit to provide a comparator function 1310.

As in the case of FIG. 12, some configurations can any combination of weak, strong, and comparator functions at the same time.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit device, comprising:
a plurality of N physical connections to the integrated circuit (IC) device;
a plurality of configurable circuit blocks, including at least one analog circuit block comprising an analog circuit section configured to generate an analog output signal, and a variable drive output section configured to drive the analog output signal with at least a first maximum drive strength on a first block output and a second maximum drive strength, less than the first maximum drive strength, on a second block output; and
a signal path network comprising at least one direct signal path to less than N of the connections, and a plurality of configurable paths between the first and second block outputs and the N connections.

2. The integrated circuit device of claim 1, wherein:
the analog circuit comprises at least one differential input stage;
and the at least one differential input stage and variable drive output section form an operational amplifier.

3. The integrated circuit device of claim 2, further including:
a compensation network comprising a plurality of interconnected elements, and configurable to alter the response of the operational amplifier.

4. The integrated circuit device of claim 2, further including:
the compensation network comprises any selected from the group of: a configurable capacitance, configurable resistance, and diodes with configurable connections.

5. The integrated circuit device of claim 1, wherein:
the first maximum drive strength includes a first maximum drive current and the second maximum drive strength includes a second maximum drive current; wherein the first maximum drive current is at least five times greater than the second maximum drive current.

6. The integrated circuit device of claim 1, wherein:
the variable drive output section comprises a plurality of analog output drivers, each having an input coupled to receive the analog output signal, and configured to provide a different maximum drive current.

7. The integrated circuit device of claim 6, further including:
the analog output drivers include a first driver with a maximum current of a first level, and a second driver with a maximum current of a second level less than the first level; wherein the first driver has an output connected to the first block output, and the second driver has an output connected to the second block output.

8. The integrated circuit device of claim 7, wherein:
the signal path network includes a switch network comprising a plurality of switches and signal paths interconnecting the configurable circuit blocks, the switches including first and second switches, the first switches having a higher maximum current carrying capability than the second switches.

9. An integrated circuit device, comprising:
a plurality of analog circuit blocks, each comprising an input section configured to receive an analog input signal, and an output section configured to drive a plurality of output signals corresponding to the input signal, each output signal having a different maximum drive strength; and
a signal network comprising a plurality of switches, and providing a configurable connection between at least outputs of the analog circuit blocks and a plurality of N connections to the integrated circuit device, including less than N direct signal paths between each analog circuit block and the N connections.

10. The integrated circuit device of claim 9, wherein:
at least one of the analog circuit blocks comprises an operational amplifier (op amp) block, the input section comprising a differential input stage, and the output section comprising a plurality of output drivers, each configured to drive an analog output of the differential input stage with a different maximum drive current.

11. The integrated circuit device of claim 10, wherein:
the op amp block further includes a comparator circuit having a comparator input coupled to the differential input stage and a comparator output different from outputs of the output drivers.

12. The integrated circuit device of claim 11, wherein:
the comparator circuit has a configurable response hysteresis.

13. The integrated circuit device of claim 10, wherein:
the op amp block further includes a compensation network corresponding to each output driver, each compensation network configurable to adjust a driver response to a load driven by the output driver.

14. The integrated circuit device of claim 9, further including:
the output section comprises a first output driver configured to drive the analog output of the differential input stage with a first maximum current, and a second output driver configured to drive the analog output of the differential input stage with a second maximum current less than the first maximum current; and
a direct signal path between an output of the first output driver and an integrated circuit output connection that does not include any switch elements; wherein an output of the second driver is coupled to the switch network.

15. The integrated circuit device of claim 9, wherein:
at least one of the analog circuit blocks includes an input stage selected from the group of: a digital-to-analog converter and an oscillator.

* * * * *